(12) United States Patent
Kim et al.

(10) Patent No.: US 11,316,072 B2
(45) Date of Patent: Apr. 26, 2022

(54) LED ELEMENT WITH AN INVERTED TAPER STRUCTURE FOR MINIMIZING A DEFECT RATE OF ELECTRODE CONNECTIONS, AND DISPLAY DEVICE USING THE SAME

(71) Applicant: LG Display Co., Ltd., Seoul (KR)

(72) Inventors: Hyunwoo Kim, Seoul (KR); Jinyeong Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 71 days.

(21) Appl. No.: 16/046,037

(22) Filed: Jul. 26, 2018

(65) Prior Publication Data
US 2019/0181301 A1 Jun. 13, 2019

(30) Foreign Application Priority Data
Dec. 7, 2017 (KR) .................. 10-2017-0167546

(51) Int. Cl.
*H01L 33/00* (2010.01)
*H01L 33/44* (2010.01)
(Continued)

(52) U.S. Cl.
CPC .......... *H01L 33/44* (2013.01); *H01L 25/0753* (2013.01); *H01L 27/1214* (2013.01);
(Continued)

(58) Field of Classification Search
CPC . H01L 25/0753; H01L 27/1214; H01L 33/06; H01L 33/20; H01L 33/32;
(Continued)

(56) References Cited

U.S. PATENT DOCUMENTS 8,729,539 B2 5/2014 Kakinuma et al.
10,084,009 B2 9/2018 Kim
(Continued)

FOREIGN PATENT DOCUMENTS

CN 1416300 A 5/2003
CN 103311268 A 9/2013
(Continued)

OTHER PUBLICATIONS

Extended European Search Report dated Sep. 27, 2018, issued in corresponding European Patent Application No. 18185521.4.
(Continued)

*Primary Examiner* — Reema Patel
(74) *Attorney, Agent, or Firm* — Morgan, Lewis & Bockius LLP

(57) ABSTRACT

A light-emitting device and a display including the same can improve the process stability during the process of disposing the light-emitting device. A light-emitting device includes the n-type semiconductor layer and the p-type semiconductor layer, and a structure is disposed so as to minimize electrical short between electrodes even if the light-emitting device is misaligned. The structure may have at least one side surface in an inverted taper shape and may be disposed between electrodes to minimize a short-circuit therebetween during the process of connecting the electrodes.

11 Claims, 6 Drawing Sheets

(51) Int. Cl.
*H01L 25/075* (2006.01)
*H01L 33/62* (2010.01)
*H01L 33/20* (2010.01)
*H01L 27/12* (2006.01)
*H01L 33/06* (2010.01)
*H01L 33/32* (2010.01)
*H01L 33/38* (2010.01)
*H01L 33/50* (2010.01)
*H01L 33/60* (2010.01)

(52) U.S. Cl.
CPC .............. *H01L 33/06* (2013.01); *H01L 33/20* (2013.01); *H01L 33/32* (2013.01); *H01L 33/38* (2013.01); *H01L 33/507* (2013.01); *H01L 33/60* (2013.01); *H01L 33/62* (2013.01)

(58) Field of Classification Search
CPC ....... H01L 33/38; H01L 33/44; H01L 33/507; H01L 33/60; H01L 33/62
See application file for complete search history.

(56) References Cited

U.S. PATENT DOCUMENTS

| | | | |
|---|---|---|---|
| 10,367,128 B2 * | 7/2019 | Li | .......................... H01L 33/62 |
| 2003/0107047 A1 | 6/2003 | Okuyama et al. | |
| 2013/0234120 A1 | 9/2013 | Kakinuma et al. | |
| 2016/0284941 A1 * | 9/2016 | Seo | ........................ H01L 33/42 |
| 2016/0372514 A1 | 12/2016 | Chang et al. | |
| 2017/0062515 A1 * | 3/2017 | Kim | ........................ H01L 33/06 |
| 2018/0122836 A1 | 5/2018 | Kang et al. | |
| 2018/0122837 A1 | 5/2018 | Kang et al. | |
| 2019/0067538 A1 * | 2/2019 | Lee | .......................... H01L 33/62 |
| 2019/0385991 A1 * | 12/2019 | Kim | ................... H01L 25/0753 |

FOREIGN PATENT DOCUMENTS

| | | | | |
|---|---|---|---|---|
| CN | 104465691 A | * | 3/2015 | ............. H01L 27/15 |
| CN | 104952899 A | | 9/2015 | |
| CN | 106486470 A | | 3/2017 | |
| EP | 3136438 A1 | | 3/2017 | |
| EP | 3 316 301 A1 | | 5/2018 | |
| EP | 3 316 302 A1 | | 5/2018 | |
| EP | 3496143 A1 | * | 6/2019 | .......... H01L 25/075 |
| JP | 2005-136177 A | | 5/2005 | |
| KR | 10-2017-0107619 A | | 9/2017 | |
| WO | WO2018135704 | * | 7/2018 | ............. H05B 33/12 |

OTHER PUBLICATIONS

Office Action dated Jan. 6, 2021, issued in corresponding Chinese Patent Application No. 201810762162.7.
Office Action dated Aug. 19, 2021, issued in corresponding European Patent Application No. 18 185 521.4.
Office Action dated Jan. 5, 2022, issued in corresponding Korean Patent Application No. 10-2017-0167546.

* cited by examiner

[Fig. 1]
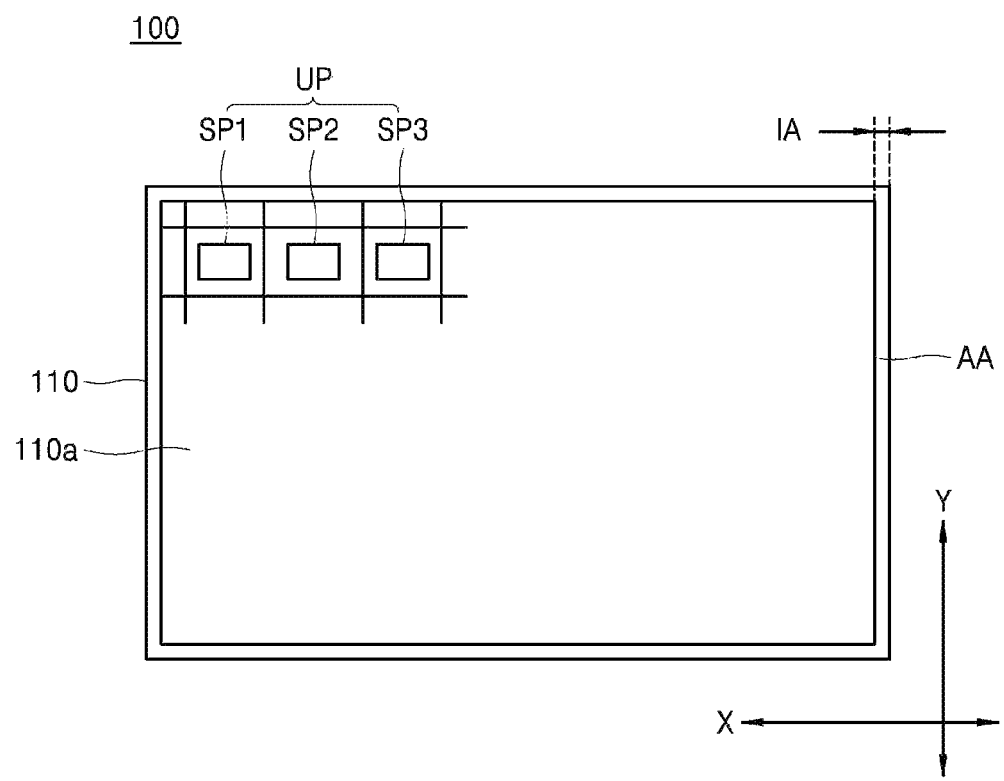

[Fig. 2]
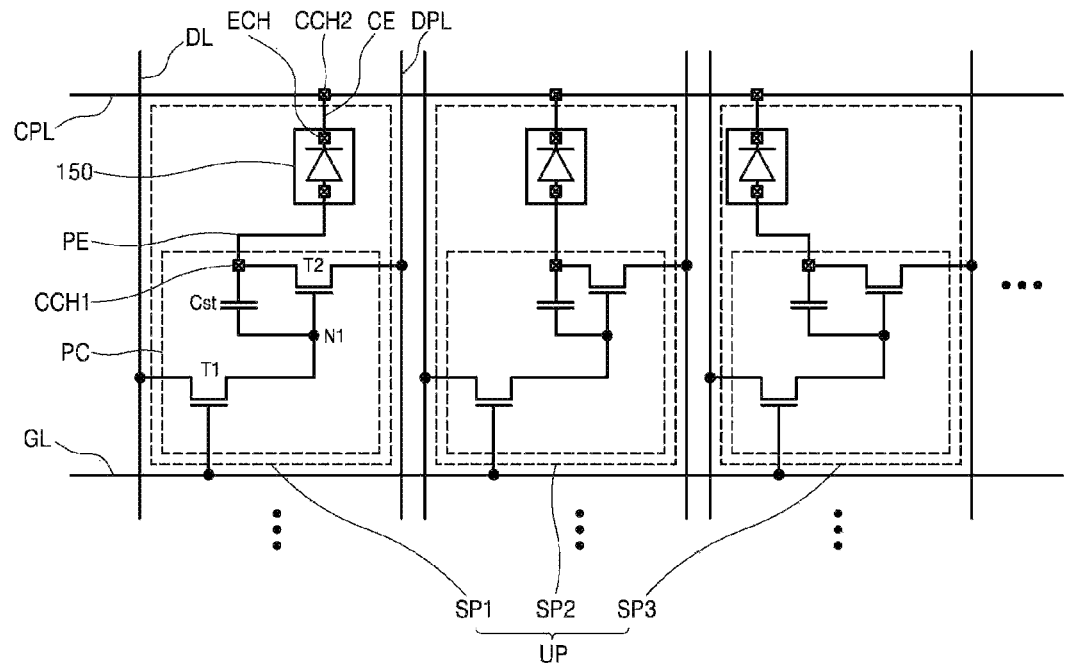
[Fig. 3]
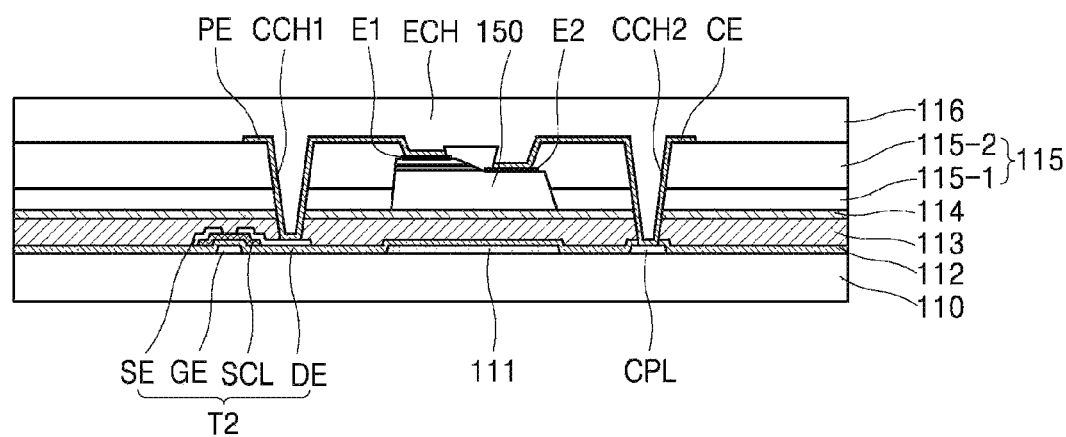

[Fig. 4A]
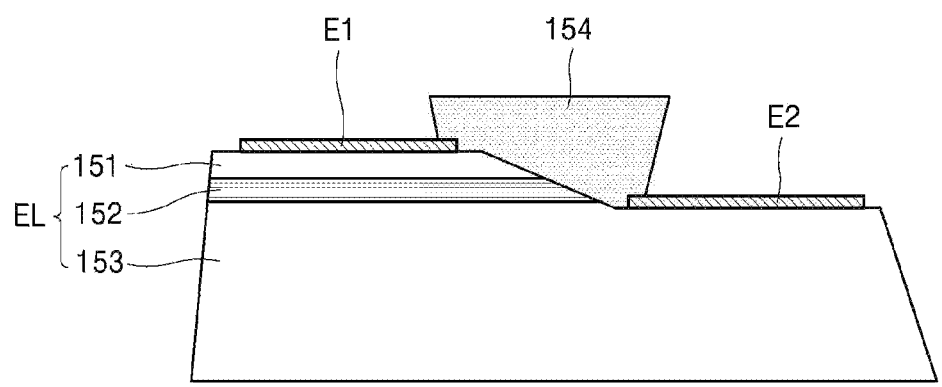
[Fig. 4B]
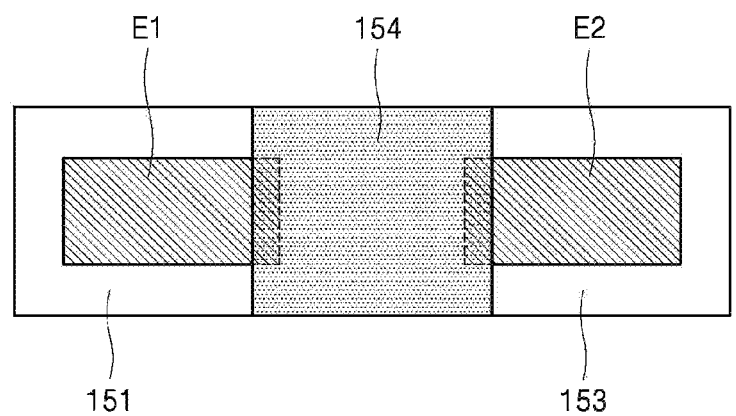

[Fig. 5A]
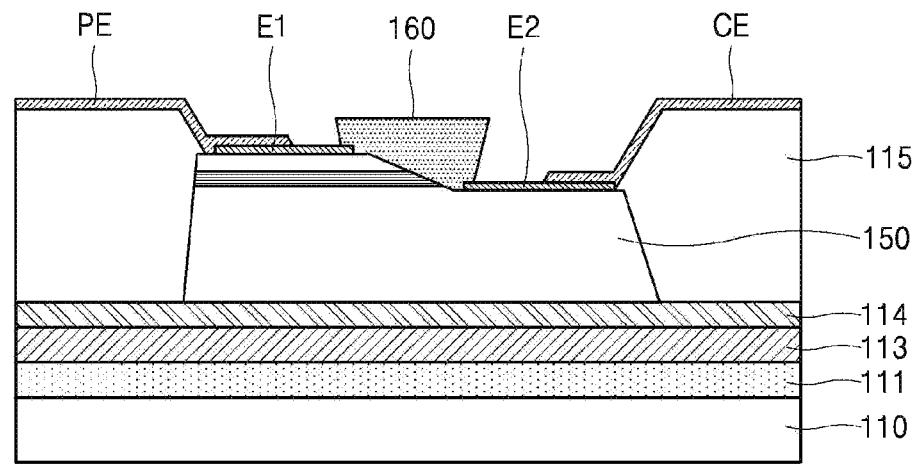
[Fig. 5B]
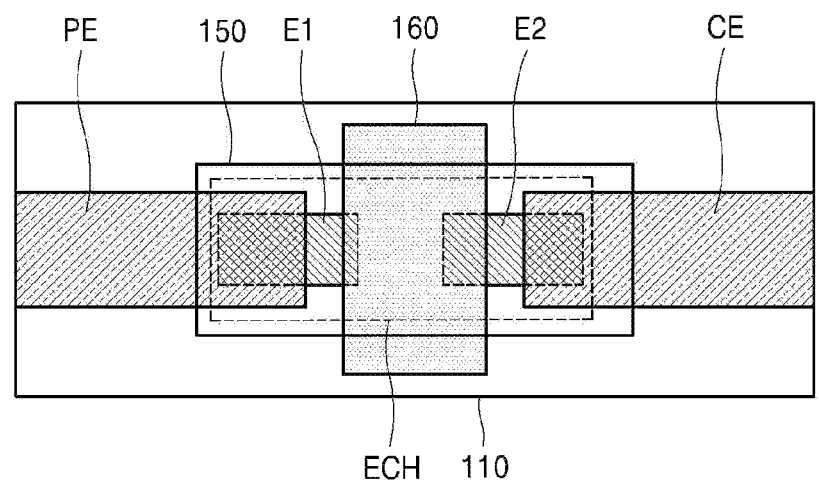

LED ELEMENT WITH AN INVERTED TAPER STRUCTURE FOR MINIMIZING A DEFECT RATE OF ELECTRODE CONNECTIONS, AND DISPLAY DEVICE USING THE SAME

CROSS-REFERENCE TO RELATED APPLICATIONS

This application claims the priority of Korean Patent Application No. 10-2017-0167546 filed on Dec. 7, 2017, in the Korean Intellectual Property Office, the disclosure of which is hereby incorporated by reference in its entirety.

TECHNICAL FIELD

The present disclosure relates to a light-emitting device and a display device using the same, and more particularly, to a light-emitting device with improved efficiency of electrode connection and stability of wiring connection in electrically connecting the light-emitting device with the wiring electrodes, thereby increasing the reliability of the device, and a display device using the same.

DESCRIPTION OF THE RELATED ART

A display device is widely used as display screens of a notebook computer, a tablet computer, a smart phone, a portable display device and a portable information device, in addition to display devices of a television or a monitor.

Display devices may be divided into a reflective display device and a light-emitting display device. The reflective display device displays information as natural light or light emitted from an external luminaire is reflected off the display device. The light-emitting display device includes a light-emitting device or a light source therein and displays information by using the light emitted from the light-emitting device or the light source.

The light-emitting device may use a light-emitting device capable of emitting various wavelengths of light, or may use a light-emitting device emitting white or blue light together with a color filter capable of changing the wavelength of emitted light.

As described above, in order to display an image on a display device, a plurality of light-emitting devices is disposed on a substrate of the display device. In order to control each light-emitting device to emit light individually, a driving element for supplying a driving signal or a driving current is disposed on the substrate together with the light-emitting device. The plurality of light-emitting devices disposed on the substrate is analyzed according to the arrangement of information to be displayed, to display the information on the substrate.

In other words, the plurality of pixels is disposed in the display device, and each of the pixels uses a thin-film transistor as a switching element which is a driving element. Each of the pixels is connected to the thin-film transistor and is driven, so that the display device displays images as the pixels are operated individually.

Representative display devices using thin-film transistors include a liquid-crystal display device and an organic light-emitting display device. Among them, a liquid-crystal display device is not a self-luminous display device, and thus it requires a backlight unit disposed under (behind) the liquid-crystal display device to emit light. Such a backlight unit increases the thickness of the liquid-crystal display device. In addition, it is not possible to implement a display device having a variety of shapes such as a flexible or circular display device with such a backlight unit. Moreover, the luminance and response speed may be lowered.

On the other hand, a display device having a self-luminous element can be made thinner than a display device having a light source, and is advantageous for a flexible and foldable display device.

Such a display device having a self-luminous element may be divided into an organic light-emitting display device including an organic material as an emission layer, and a micro-LED display device using a micro-LED element as a light-emitting device. Such a self-luminous display device, such as an organic light-emitting display device and a micro-LED display device, does not require an additional light source, and thus can be used for thin display devices having various shapes.

However, even though an organic light-emitting display device using an organic material does not require an additional light source, there is a problem that a defective pixel may occur due to moisture and oxygen. Accordingly, a variety of technical ideas are additionally required to minimize permeation of oxygen and moisture.

Regarding the above-mentioned problem, research and development on a display device using a micro-sized micro light-emitting diode as a light-emitting device have been progressed recently. Such a light-emitting display device has attracted attention as a next-generation display device because of its high image quality and high reliability.

An LED element is a semiconductor light-emitting device utilizing the property that light is emitted when a current flows in a semiconductor device. Such LED elements are widely employed by luminaires, TVs, a variety of display devices, etc. An LED element is composed of an n-type semiconductor layer, a p-type semiconductor layer, and an active layer therebetween. When a current flows, electrons in the n-type semiconductor layer and holes in the p-type semiconductor layer recombine in the active layer to emit light.

The LED element is composed of a compound semiconductor such as GaN, and can inject a high current due to the property of the inorganic material, thereby achieving a high luminance. In addition, the LED element has high reliability since it is less affected by the environment such as heat, moisture and oxygen.

In addition, the LED element has an internal quantum efficiency of about 90%, which is higher than that of organic light-emitting display devices. Therefore, there are advantages that it can display high luminance images and consume less power.

Further, unlike organic light-emitting display devices, the influence by oxygen and moisture is ignorable in using an inorganic material. Therefore, no additional encapsulation layer or substrate for minimizing permeation of moisture and oxygen is required, and thus it is possible to reduce the inactive area of the display device which is a margin area where an encapsulation layer or substrate is disposed.

After a light-emitting device such as an LED element is formed on a separate substrate, a process of transplanting it to a display device may be necessary. In order to provide the display device having the advantages as described above, there are required a technique of disposing the light-emitting device at a correct location on the display device, and a technique minimizing errors that may occur during the process of disposing the light-emitting device. There are many research activities on this.

SUMMARY

As mentioned above, there are several technical requirements for implementing a light-emitting display device employing an LED element as a light-emitting device of a unit pixel. Initially, LED elements are crystallized on a semiconductor wafer substrate such as sapphire or silicon (Si), and the crystallized LED elements are moved to a substrate where a driving element is disposed. In doing so, a sophisticated transfer process for positioning the LED elements at locations corresponding to the respective pixels is required.

Although the LED element may be formed using an inorganic material, it is necessary to crystallizing them. In order to crystallize an inorganic material such as GaN, the inorganic material has to be crystallized on a substrate capable of inducing crystallization. The substrate capable of efficiently inducing crystallization of the inorganic material is a semiconductor substrate. The inorganic material has to be crystallized on the semiconductor substrate as described above.

The process of crystallizing the LED element is also referred to as epitaxy, epitaxial growth or epitaxial process. An epitaxial process refers to growing a film on the surface of a crystal with a specific orientation relationship. In order to form the device structure of an LED element, a GaN compound semiconductor has to be stacked on the substrate in the form of a pn junction diode. At this time, each layer is grown by inheriting the crystallinity of the underlying layer.

A defect inside the crystal acts as a nonradiative center in the electron-hole recombination process. Therefore, in an LED device using photons, the crystallinity of the crystals forming each layer has a great influence on the device efficiency.

Currently, the sapphire substrate is commonly used as the substrate mainly. Recently, research is ongoing into GaN-based substrates.

The price of the semiconductor substrate required for crystallizing the inorganic material such as GaN constituting the LED element on the semiconductor substrate is high. Therefore, when a large amount of LEDs are used as light-emitting pixels of a display device, rather than LEDs as a light source used for simple luminaire or a backlight unit, there is a problem that the production cost is increased.

In addition, as described above, the LED element formed on the semiconductor substrate requires a step of transferring it to the substrate of a display device. In doing so, it is difficult to separate the LED element from the semiconductor substrate. Furthermore, it is more difficult to transplant the separated LED element to a designed location correctly.

In transferring the LED element formed on the semiconductor substrate to a substrate for implementing a display device, a variety of transferring method may be available, including a method of using a polymer-material based substrate for transferring such as PDMS, a method of transferring using an electromagnetic force or electrostatic force, or a method of picking and moving one by one, etc.

Such a transfer process is related to the productivity of the process of fabricating display devices, and thus it would be inefficient to transfer the LED elements one by one for mass production.

Accordingly, a precise transfer process or technique is required in order to separate a plurality of LED elements from a semiconductor substrate using a substrate for transfer made of a polymer material to locate them to a substrate of a display device, especially on a pad electrode connected to a driving element and a power electrode disposed in a thin-film transistor.

During the above-described transferring process or subsequent processes that follow the transferring process, there may be defects, e.g., the LED element is flipped over while it is moved or transferred depending on conditions such as vibration or heat. There were many difficulties in finding and recovering such defects.

Hereinafter, the defects will be described in more detail with reference to a general transfer process as an example.

First, an LED element is formed on a semiconductor substrate, and an electrode is formed thereon, so that an individual LED element is completed. Subsequently, the semiconductor substrate is brought into contact with the PDMS substrate (hereinafter referred to as a transfer substrate). In this process, the LED elements have to be transferred from the semiconductor substrate to the transfer substrate taking into account the pixel pitch among the pixels of the actual display substrate. Therefore, when the transfer substrate has protruded features or the like for receiving the LED elements, the protruded features or the like has to be disposed considering the pixel pitch.

Subsequently, a laser is irradiated onto the LED elements through the back surface of the semiconductor substrate, thereby separating the LED elements from the semiconductor substrate. In the process of irradiating the laser, when the LED element is separated from the semiconductor substrate, the GaN material of the semiconductor substrate may be physically and rapidly expanded due to concentration of the high energy of the laser, possibly resulting in shock. As a result, when the LED elements are transferred to the transfer substrate, the LED elements may be pushed such that it may be transferred to an undesirable location. (This is referred to as primary transfer.)

Subsequently, the LED elements transferred onto the transfer substrate are transferred onto the substrate of the display device. A passivation layer for insulating/protecting a thin-film transistor is disposed on a substrate, and then an adhesive layer is disposed on the passivation layer.

When the transfer substrate is brought into contact with the substrate of the display device to receive pressure, the LED elements transferred onto the transfer substrate are transferred to the substrate of the display device by the adhesive layer on the passivation layer.

If the adhesive force between the transfer substrate and the LED elements is smaller than the adhesive force between the substrate of the display device and the LED element, the LED elements on the transfer substrate can be transferred to the substrate of the display device. (This is referred to as secondary transfer).

The size of the semiconductor substrate is basically different from, and typically smaller than the size of the substrate of the display device. Due to such difference in area and size, the above-described primary and secondary transfer processes are repeated by dividing the substrate of the display device into sub-areas, so that the LED elements can be transferred to the display device.

In the process of repeating the primary transfer and the secondary transfer, the LED elements can be transferred to an undesirable location. Various errors may occur depending on the number of transfer processes or the process variation of the transfer processes.

The LED elements formed on the semiconductor substrate may be red, blue and green LED elements depending on the type thereof, or may be a white LED element. In the method of implementing pixels of a display device using LED elements emitting light of different wavelengths, the number of times of the primary and secondary transfer processes described above may be further increased.

The LED elements may be flipped over or rotated in the primary and secondary transfer processes, as described above. This increases the number of defective pixels of the display device and increases production cost. In view of the above, the inventors of the application have devised an LED element which is a light-emitting device capable of being disposed more stably, and a display device using the same.

Accordingly, embodiments of the present disclosure are directed to a light-emitting device and a display device using the same that substantially obviate one or more of the problems due to limitations and disadvantages of the related art.

An object of the present disclosure is to provide a light-emitting device capable of minimizing defect rate of display devices by way of electrically connecting a light-emitting device even if it is misaligned away from a location during a process of transferring and disposing the light-emitting device.

It should be noted that objects of the present disclosure are not limited to the above-described objects, and other objects of the present disclosure will be apparent to those skilled in the art from the following descriptions.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a light-emitting device is provided that can be disposed stably, and a display device including the same are provided. The light-emitting device may include an n-type semiconductor layer and a p-type semiconductor layer. An n-type electrode is disposed on the n-type semiconductor layer, and a p-type electrode is disposed on the p-type semiconductor layer. A structure may be disposed between the n-type electrode and the p-type electrode. The structure may have at least one side surface in an inverted taper shape adjacent to the p-type electrode or the n-type electrode.

In this manner, an inverted tapered structure is disposed between the n-type electrode and the p-type electrode, to minimize a defect that the two electrodes are electrically connected during the process of connecting the p-type electrode and the n-type electrode to the pixel electrode or the common electrode. As a result, it is possible to minimize the defect rate of the display device by minimizing the defective connection of the electrodes even if the light-emitting device is misaligned during the process of disposing it.

According to an exemplary embodiment of the present disclosure, a light-emitting device having a structure that can improve processing stability to dispose the light-emitting device is employed, so that defects of display devices can be reduced while productivity can be improved. In addition, by employing the light-emitting device, processing convenience can be improved.

It should be noted that effects of the present disclosure are not limited to those described above and other effects of the present disclosure will be apparent to those skilled in the art from the following descriptions.

The Summary is not to specify essential features of the appended claims, and thus the scope of the claims is not limited thereby.

It is to be understood that both the foregoing general description and the following detailed description are exemplary and explanatory and are intended to provide further explanation of the inventive concepts as claimed

BRIEF DESCRIPTION OF DRAWINGS

The accompanying drawings, which are included to provide a further understanding of the disclosure and are incorporated and constitute a part of this application, illustrate embodiments of the disclosure and together with the description serve to explain various principles. In the drawings:

FIG. 1 is a schematic plan view of a light-emitting device according to an exemplary embodiment of the present disclosure;

FIG. 2 is a circuit diagram for illustrating a configuration of a unit pixel according to the exemplary embodiment shown in FIG. 1;

FIG. 3 is a cross-sectional view illustrating an arrangement of a light-emitting device according to an exemplary embodiment of the present disclosure and connection of electrodes;

FIGS. 4A and 4B are plan views illustrating a light-emitting device according to an exemplary embodiment of the present disclosure;

FIGS. 5A and 5B are views for illustrating connection of electrodes of an light-emitting device according to an exemplary embodiment of the present disclosure.

DETAILED DESCRIPTION

Figure 6A:
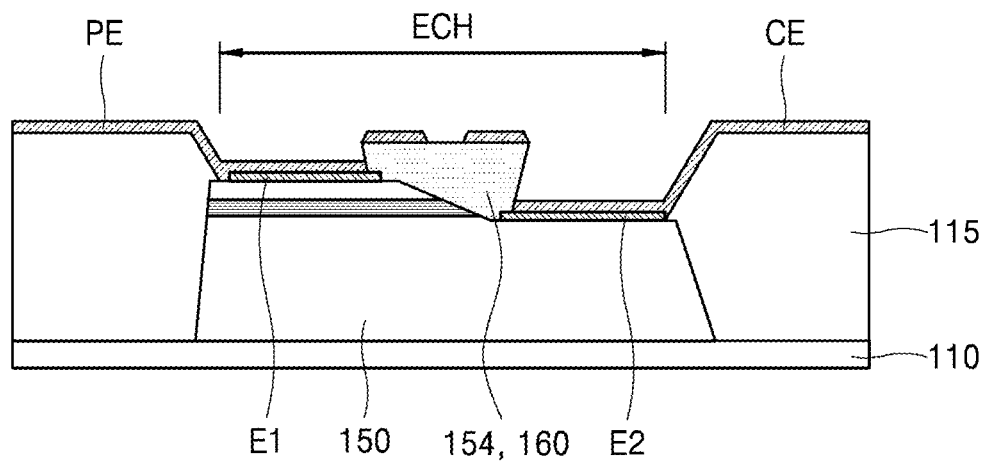
FIGS. 6A to 6D are cross-sectional views for illustrating electrode connection of a light-emitting device according to various exemplary embodiments of the present disclosure.

Advantages and features of the present disclosure and methods to achieve them will become apparent from the descriptions of exemplary embodiments hereinbelow with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used.

In describing temporal relationship, terms such as "after," "subsequent to," "next to" and "before" are not limited to "directly after," "directly subsequent to," "immediately next to" "immediately before," and so on, unless otherwise specified.

In describing flow of signals, such as "a signal is delivered from node A to node B," a signal may be delivered from node A to node B via another node unless the term "directly" or "immediately" is explicitly used.

The terms first, second, third and the like in the descriptions and in the claims are used for distinguishing between similar elements and not necessarily for describing a sequential or chronological order. Theses terms are used to merely distinguish one element from another. Accordingly, as used herein, a first element may be a second element within the technical idea of the present disclosure.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

FIG. 1 is a plan view of a light-emitting display device according to an exemplary embodiment of the present disclosure. FIG. 2 is a circuit diagram for illustrating a configuration of a unit pixel according to the exemplary embodiment shown in FIG. 1. Referring to FIGS. 1 and 2, a light-emitting display device 100 according to the exemplary embodiment of the present disclosure includes a substrate 110 on which an active area AA where a plurality of unit pixels UP is disposed, and an inactive area IA are defined.

Each of the unit pixels UP may include a plurality of sub-pixels SP1, SP2 and SP3 on a front face 110a of the substrate 110. Although the sub-pixels SP1, SP2 and SP3 typically may emit red, blue and green light, respectively, this is not limiting. For example, the sub-pixels may include a sub-pixel emitting white light.

The substrate 110 may be a thin-film transistor array substrate made of glass or a plastic material. It may be formed by attaching two or more substrates together or by stacking two or more layers. The inactive area IA may be defined as a region on the substrate 110 except for the active area AA, which may have a relatively very small width and may be defined as a bezel area.

The plurality of unit pixels UP is disposed in the active area AA. The unit pixels UP are arranged in the active area AA such that they have a predetermined first reference pixel pitch along the x-axis direction and have a predetermined second reference pixel pitch along the y-axis direction. The first reference pixel pitch may be defined as the distance between the centers of adjacent unit pixels UP. The second reference pixel pitch may be defined as the distance between the centers of adjacent unit pixels UP in the reference direction, similar to the first reference pixel pitch.

The distance among the sub-pixels SP1, SP2 and SP3 of each unit pixel UP may also be defined as a first reference sub-pixel pitch and a second reference sub-pixel pitch, similar to the first reference pixel pitch and the second reference pixel pitch.

In the light-emitting display device 100 including an LED element 150 as an LED element, the width of the inactive area IA may be smaller than the pixel pitches or the sub-pixel pitches described above. When a multi-screen display device is implemented with the light-emitting display device 100, the width of the inactive area IA is smaller than the pixel pitches or the sub-pixel pitches, and thus it is possible to implement a multi-screen display device having substantially no bezel area.

In order to implement such a multi-screen display device with no or substantially no bezel area, the first reference pixel pitch, a second reference pixel pitch, the first reference sub-pixel pitch and the second reference sub-pixel pitch may be maintained constant in the active area of the light-emitting display device 100. Alternatively, by dividing the active area AA into several sub-areas so that different sub-areas have different pitches, and by making the pixel pitches of the sub-areas adjacent to the inactive area IA are larger than those of the other sub-areas, the size of the bezel area can be made smaller than the pixel pitches.

In the light-emitting display device 100 having different pixel pitches, distortion of images may occur. To overcome it, image processing is performed in such a manner that image data is sampled in comparison with adjacent areas in consideration of the pixel pitches. By doing so, the bezel area can be reduced while minimizing the distortion of the image.

However, in reducing the size of the inactive area IA, the minimum area is required for a pad area for connecting to circuitry that supplies power to and transmits/receives data signals to/from the unit pixels UP having the LED elements 150, and an area for a drive IC, etc.

The configuration and circuit structure of the sub-pixels SP1, SP2 and SP3 of each of the unit pixels UP of the light-emitting display device 100 will be described with reference to FIG. 2. Pixel drive lines are provided on the front surface 110a of the substrate 110 and supply necessary signals to each of the plurality of sub-pixels SP1, SP2, and SP3. According to the exemplary embodiment of the present disclosure, the pixel drive lines include a plurality of gate lines GL, a plurality of data lines DL, a plurality of driving power lines DPL, and a plurality of common power lines CPL.

The plurality of gate lines GL is disposed on the front face 110a of the substrate 110 and is extended in a first horizontal axis direction X of the substrate 110 while being spaced apart from one another in a second horizontal axis direction Y.

The plurality of data lines DL is disposed on the front face 110a of the substrate 110 such that they intersect with the gate lines GL and is extended in the second horizontal axis direction Y of the substrate 110 while being spaced apart from one another in the first horizontal axis direction X.

The driving power lines DPL are disposed on the substrate 110 such that they are parallel to the data lines DL and may be formed together with the data lines DL. Each of the driving power lines DPL supplies a pixel drive power provided from an external source to the adjacent sub-pixels SP.

The common power lines CPL are disposed on the substrate 110 such that they are parallel to the gate lines DL and may be formed together with the gate lines GL. Each of the common power lines CPL supplies a common power provided from an external source to the adjacent sub-pixels SP1, SP2 and SP3.

Each of the plurality of sub-pixels SP1, SP2 and SP3 is disposed in a sub-pixel region defined by the respective gate lines GL and data lines DL. Each of the plurality of sub-pixels SP1, SP2, and SP3 may be defined as a minimum unit region from which light is actually emitted.

At least three sub-pixels SP1, SP2 and SP3 adjacent to one another may form a single unit pixel UP for representing a color. For example, a single unit pixel UP may include a red sub-pixel SP1, a green sub-pixel SP2 and a blue sub-pixel SP3 adjacent to one another along the first horizontal axial direction X and may further include a white sub-pixel to improve the luminance.

Optionally, each of the plurality of driving power lines DPL may be disposed in the respective unit pixels UP. Then, at least three sub-pixels SP1, SP2 and SP3 of each of the unit pixels UP share one driving power line DPL. As a result, it is possible to reduce the number of driving power lines for driving the sub-pixels SP1, SP2 and SP3, so that the aperture ratio of each unit pixel UP can be increased by the number of reduced driving power lines, or the size of each unit pixel UP can be reduced.

Each of the plurality of sub-pixels SP1, SP2 and SP3 according to an exemplary embodiment of the present disclosure includes a pixel circuit PC and an LED element 150.

The pixel circuit PC is disposed in a circuit region defined in each of the sub-pixels SP and is connected to the adjacent gate line GL, data line DL and driving power line DPL. The pixel circuit PC controls a current flowing through the LED element 150 according to a data signal from the data line DL in response to a scan pulse from a gate line GL based on a pixel drive power supplied from the driving power line DPL. According to an exemplary embodiment of the present disclosure, the pixel circuit PC includes a switching thin-film transistor T1, a driving thin-film transistor T2, and a capacitor Cst.

The switching thin-film transistor T1 includes a gate electrode connected to a gate line GL, a first electrode connected to a data line DL, and a second electrode connected to a gate electrode N1 of the driving thin-film transistor T2. The first and second electrodes of the switching thin-film transistor T1 may be a source electrode and a drain electrode or vice versa depending on the current direction. The switching thin-film transistor T1 is switched on/off in response to a scan pulse supplied to the gate line GL to supply a data signal supplied to the data line DL to the driving thin-film transistor T2.

The driving thin-film transistor T2 is turned on by the voltage supplied from the switching thin-film transistor T1 and/or the voltage of the capacitor Cst, to control the amount of the current flowing from the driving power line DPL to the LED element 150. To this end, the driving thin-film transistor T2 according to an exemplary embodiment of the present disclosure includes a gate electrode connected to the second electrode N1 of the switching thin-film transistor T1, a drain electrode connected to the driving power line DPL, and a source electrode connected to the LED element 150. The driving thin-film transistor T2 controls the data current flowing from the driving power line DPL to the LED element 150 based on the data signal supplied from the switching thin-film transistor T1, to control the emission of the LED element 150.

The capacitor Cst is disposed in an area where the gate electrode N1 and the source electrode of the driving thin-film transistor T2 overlaps with each other, and stores a voltage corresponding to a data signal supplied to the gate electrode of the driving thin-film transistor T2, to turn on the driving thin-film transistor T2 with the stored voltage.

Optionally, the pixel circuit PC may further include at least one compensating thin-film transistor for compensating for a change in the threshold voltage of the driving thin-film transistor T2, and may further include at least one auxiliary capacitor. The pixel circuit PC may further receive a compensating power such as an initializing voltage depending on the numbers of the thin-film transistors and the auxiliary capacitors. Accordingly, the pixel circuit PC according to the exemplary embodiment of the present disclosure drives the LED element 150 by current driving manner like the sub-pixels of an organic light-emitting display device, and thus the pixel circuit PC can be adapted for a pixel circuit of an organic light-emitting display device known in the art.

The LED element 150 is disposed in each of the plurality of sub-pixels SP1, SP2 and SP3. The LED element 150 is electrically connected to the pixel circuit PC of the sub-pixel SP and the common power line CPL so that it emits light as the current flows therethrough from the pixel circuit PC, i.e., the driving thin-film transistor T2 to the common power line CPL. The LED element 150 according to an exemplary embodiment of the present disclosure may be an optical element or a light-emitting diode chip that emits one of red light, green light, blue light, and white light. The light-emitting diode chip may have, but is not limited to, a scale of 1 to 100 micrometers. The chip may have a size smaller than the size of the remaining emission region excluding the circuit area occupied by the pixel circuit PC in the sub-pixel area.

FIG. 3 is a cross-sectional view illustrating an arrangement of a light-emitting device according to an exemplary embodiment of the present disclosure and connection of electrodes. Description will be made with reference to FIG. 3 in conjunction with FIGS. 1 and 2.

Each of the sub-pixels SP1, SP2 and SP3 of the display device according to an exemplary embodiment of the present disclosure includes a passivation layer 113, an LED element 150, planarization layers 115-1 and 115-2, a pixel electrode PE, and a common electrode CE.

Although the substrate 110 is shown as being relatively thin in FIG. 3, the substrate 110 may be much thicker than the overall thickness of the layer structure formed on the substrate 110. The substrate 110 may be made up of a plurality of layers or may be formed by attaching a plurality of substrates together.

The pixel circuit PC includes a switching thin-film transistor T1, a driving thin-film transistor T2, and a capacitor C. The pixel circuit PC is identical to that described above; and, therefore, the redundant description will be omitted. Hereinafter, the structure of the driving thin-film transistor T2 will be described by way of example.

The driving thin-film transistor T2 includes a gate electrode GE, a semiconductor layer SCL, a source electrode SE, and a drain electrode DE.

The gate electrode GE is disposed on the substrate 110 together with the gate line GL. The gate electrode GE is covered by the gate insulating layer 112. The gate insulating layer 112 may be made up of a single layer or multiple layers made of inorganic material, for example, silicon oxide (SiOx) and silicon nitride (SiNx).

The semiconductor layer SCL is disposed on the gate insulating layer 112 in a predetermined pattern (or in the form of an island) such that it overlaps with the gate electrode GE. The semiconductor layer SCL may be made of, but is not limited to, a semiconductor material composed of one of amorphous silicon, polycrystalline silicon, oxide, and organic material.

The source electrode SE is disposed such that it overlaps with one side of the semiconductor layer SCL. The source electrode SE is disposed together with the data line DL and the driving power line DPL.

The drain electrode DE is disposed such that it overlaps with the other side of the semiconductor layer SCL and spaced apart from the source electrode SE. The drain electrode DE is disposed together with the source electrode SE and branches off or protrudes from an adjacent driving power line DPL.

In addition, the switching thin-film transistor T1 of the pixel circuit PC is disposed with the same structure as the driving thin-film transistor T2. At this time, the gate electrode of the switching thin-film transistor T1 branches off or protrudes from the gate line GL. The first electrode of the switching thin-film transistor T1 branches off or protrudes from the data line DL. The second electrode of the switching thin-film transistor T1 is connected to the gate electrode GE of the driving thin-film transistor T2 through a via hole formed in the gate insulating layer 112.

The passivation layer 113 is formed over the entire surface of the substrate 110 such that it covers the sub-pixel SP, i.e., the pixel circuit PC. The passivation layer 113 protects the pixel circuit PC and provides a flat surface. The passivation layer 113 may be made of an organic material such as benzocyclobutene or photo-acryl. Preferably, the passivation layer 113 may be made of a photo-acrylic material for convenience of process.

The LED element 150 according to an exemplary embodiment of the present disclosure may be disposed on the passivation layer 113 by using an adhesive member 114. Alternatively, the LED element 150 may be disposed in a recess formed in the passivation layer 113. When the LED element 150 is disposed in the recess, an inclined surface of the recess in the passivation layer 113 may lead the light emitted from the LED element 150 in a particular direction to improve the luminous efficiency.

The LED element 150 is electrically connected to the pixel circuit PC and the common power line CPL so that it emits light as the current flows therethrough from the pixel circuit PC, i.e., the driving thin-film transistor T2 to the common power line CPL. The LED element 150 according to an exemplary embodiment of the present disclosure includes an emission layer EL, a first electrode (or an anode terminal) E1, and a second electrode (or a cathode terminal) E2.

The LED element 150 emits light as electrons and holes recombine according to the current flowing between the first electrode E1 and the second electrode E2.

The planarization layers 115-1 and 115-2 are disposed on the passivation layer 113 such that it covers the LED element 150. Specifically, the planarization layers 115-1 and 115-2 are disposed on the passivation layer 113 with a sufficient thickness to cover the entire surface of the passivation layer 113, i.e., the LED element 150 and the rest of the front surface.

The planarization layers 115-1 and 115-2 may be made up of a single layer. Alternatively, the planarization layers 115-1 and 115-2 may be made up of multi-layer structure including the first planarization layer 115-1 and the second planarization layer 115-2, as shown in the drawings.

The planarization layers 115-1 and 115-2 provide a flat surface over the passivation layer 113. In addition, the planarization layers 115-1 and 115-2 serve to fix the position of the LED element 150.

The pixel electrode PE connects the first electrode E1 of the LED element 150 to the drain electrode DE of the driving thin-film transistor T2. The first electrode E1 may be connected to the source electrode SE depending on the configuration of the thin-film transistor T2. The pixel electrode PE may be defined as an anode electrode. The pixel electrode PE according to an exemplary embodiment of the present disclosure is disposed on the front surfaces of the planarization layers 115-1 and 115-2 overlapping the first electrode E1 of the LED element 150 and the driving thin-film transistor T2. The pixel electrode PE is electrically connected to the drain electrode DE or the source electrode of the driving thin-film transistor T2 through a first circuit contact hole CCH1 formed in the passivation layer 113 and the planarization layers 115-1 and 115-2, and is electrically connected to the first electrode E1 of the LED element 150 through an electrode contact hole ECH formed in the planarization layers 115-1 and 115-2. Accordingly, the first electrode E1 of the LED element 150 is electrically connected to the drain electrode DE or the source electrode SE of the driving thin-film transistor T2 through the pixel electrode PE.

Although the drain electrode DE is connected to the pixel electrode PE in the foregoing description, the source electrode SE may also be connected to the pixel electrode PE, as desired by those skilled in the art.

The pixel electrode PE may be made of a transparent conductive material if the display device is of a top emission type and may be made of a reflective conductive material if the display device is of a bottom emission type. The transparent conductive material may be, but is not limited to, indium tin oxide (ITO), indium zinc oxide (IZO), etc. The reflective conductive material may be, but is not limited to, Al, Ag, Au, Pt or Cu. The pixel electrode PE made of the reflective conductive material may be made up of a single layer including the reflective conductive material or multiple layers formed by stacking the single layer one on another.

The common electrode CE electrically connects the second electrode E2 of the LED element 150 with the common power line CPL and may be defined as a cathode electrode. The common electrode CE is disposed on the front surface of the planarization layers 115-1 and 115-2 overlapping the common power line CPL while overlapping the second electrode E2 of the LED element 150. The common electrode CE may be made of the same material as the pixel electrode PE.

According to an exemplary embodiment of the present disclosure, one side of the common electrode CE is electrically connected to the common power line CPL through a second circuit contact hole CCH2 formed in the gate insulating layer 112, the passivation layer 113 and planarization layers 115-1 and 115-2 overlapping the common power line CPL. The other side of the common electrode CE is electrically connected to the second electrode E2 of the LED element 150 through an electrode contact hole ECH formed in the planarization layers 115-1 and 115-2 overlapping the second electrode E2 of the LED element 150. Accordingly, the second electrode E2 of the LED element 150 is electrically connected to the common power line CPL through the common electrode CE.

According to an exemplary embodiment of the present disclosure, the pixel electrode PE and the common electrode CE may be formed together by an electrode patterning process using a deposition process to deposit an electrode material on the planarization layers 115-1 and 115-2 including the first and second circuit contact holes CCH1 and CCH2 and the electrode contact hole ECH, a photolithography process and an etch process. Accordingly, according to an exemplary embodiment of the present disclosure, the pixel electrode PE and the common electrode CE connecting the LED element 150 to the pixel circuit PC can be disposed at the same time, such that the electrode connecting process can be simplified. In addition, the processing time for connecting the LED element 150 to the pixel circuit PC can be greatly shortened and the productivity of the display device can be improved.

According to an exemplary embodiment of the present disclosure, the display device further includes a transparent buffer layer 116.

The transparent buffer layer 116 is disposed on the substrate 110 such that it covers the entirety of the planarization layers 115-1 and 115-2 with the pixel electrode PE and the common electrode CE, to form a flat surface over the planarization layers 115-1 and 115-2 and protect the LED element 150 and the pixel circuit PC from an external impact. Accordingly, the pixel electrode PE and the common electrode CE are disposed between the planarization layers 115-1 and 115-2 and the transparent buffer layer 116. According to an exemplary embodiment of the present disclosure, the transparent buffer layer 116 may be, but is not limited to, an optical clear adhesive (OCA) or an optical clear resin (OCR).

According to an exemplary embodiment of the present disclosure, the display device further includes a reflective layer 111 disposed under the emission region of each of the sub-pixels SP.

The reflective layer 111 is disposed on the substrate 110 such that it overlaps with the emission region including the LED element 150. The reflective layer 111 according to an exemplary embodiment of the present disclosure may be, but is not limited to being, formed of the same material as the gate electrode GE of the driving thin-film transistor T2 and disposed on the same layer as the gate electrode GE. The reflective layer 111 may be formed of the same material as one of the electrodes of the driving thin-film transistor T2.

The reflective layer 111 reflects the light incident from the LED element 150 back to the above of the LED element 150. Accordingly, the display device according to the exemplary embodiment of the present disclosure including the reflective layer 111 has a top emission structure. However, when the display device according to an exemplary embodiment of the present disclosure has a bottom emission structure, the reflective layer 111 may be omitted or disposed on the above the LED element 150.

Optionally, the reflective layer 111 may be formed of the same material as the source electrode SE/the drain electrode DE of the driving thin-film transistor T2 and disposed on the same layer as the source electrode SE/the drain electrode DE.

In the display device according to an exemplary embodiment of the present disclosure, the LED element 150 mounted in each of the sub-pixels SP may be disposed on a part of the adhesive member 114 above the reflective layer 111

The adhesive member 114 primarily fixes the LED element 150 of each of the sub-pixels SP. According to an exemplary embodiment of the present disclosure, the adhesive member 114 is in contact with the bottom of the LED element 150. It prevents the dislocation of the LED element 150 during the mounting process and can facilitate the LED element 150 smoothly separated from an intermediate substrate used for transplanting, thereby minimizing defects in the process of transplanting the LED element 150.

According to an exemplary embodiment of the present disclosure, the adhesive member 114 may be attached under the LED element 150 by being dotted on each of the sub-pixels SP and spread by the pressing force applied in the mounting process of the light-emitting device. Accordingly, the position of the LED element 150 can be primarily fixed by the adhesive member 114. Therefore, according to the exemplary embodiment of the present disclosure, the mounting process of the light-emitting device is performed by simply attaching the LED element 150 to the surface, so that the time taken for the mounting process of the light-emitting device can be greatly shortened.

The adhesive member 114 is interposed between the passivation layer 113 and the planarization layers 115-1 and 115-2 and interposed between the LED element 150 and the passivation layer 113. According to another example, the adhesive member 114 is coated on the entire surface of the passivation layer 113 generally at an even thickness, but a part of the adhesive member 114 where contact holes are to be formed may be removed when the contact holes are formed. Accordingly, according to an exemplary embodiment of the present disclosure, the adhesive member 114 is coated on the entire front surface of the passivation layer 113 at an even thickness immediately before the mounting process of the light-emitting device, thereby shortening the processing time for disposing the adhesive member 114.

According to an exemplary embodiment of the present disclosure, the adhesive member 114 is disposed over the entire front surface of the passivation layer 113, such that the planarization layers 115-1 and 115-2 of this example cover the adhesive member 114.

According to another exemplary embodiment of the present disclosure, there is a recess for separately accommodating the LED element 150, which may be attached inside the recess by the adhesive member 114. However, the recess for accommodating the LED element 150 described above may be eliminated depending on process conditions for implementing the display device.

According to an exemplary embodiment of the present disclosure, the mounting process of the light-emitting device may include a process of mounting a red light-emitting device in each of the red sub-pixels SP1, a process of mounting a green light-emitting device in each of the green sub-pixels SP2, and a process of mounting a blue light-emitting device in each of the blue sub-pixels SP3, and may further include a process of mounting a white light-emitting device in each of the white sub-pixels.

According to an exemplary embodiment of the present disclosure, the mounting process may include only a process of mounting a white light-emitting device in each of the sub pixels. In this case, the substrate 110 includes a color filter layer overlapping each sub-pixel. The color filter layer transmits only light having a wavelength of a color corresponding to the respective sub-pixel among the white light.

According to an exemplary embodiment of the present disclosure, the mounting process may include only a process of mounting a light-emitting device of a first color in each of the sub-pixels. In this case, the substrate 110 includes a wavelength converting layer and a color filter layer overlapping each sub-pixel. The wavelength converting layer emits light of a second color based on a part of the light of the first color incident from the light-emitting device. The color filter layer transmits only light having a wavelength of a color corresponding to the respective sub-pixel among the white light produced from mixture of the light of the first color and the light of the second color. The first color may be blue and the second color may be yellow. The wavelength converting layer may include a phosphor or quantum dots that emits the light of the second color based on the light of the first color.

FIGS. 4A and 4B are plan views illustrating a light-emitting device according to an exemplary embodiment of the present disclosure. Description will be made with reference to FIGS. 4A and 4B in conjunction with FIGS. 1 to 3.

According to an exemplary embodiment of the present disclosure, an LED element 150 includes an emission layer EL, a first electrode E1, a second electrode E2, and a structure 154. The emission layer EL includes a first semiconductor layer 151, an active layer 152 and a second semiconductor layer 152. The LED element 150 emits light as electrons and holes recombine according to the current flowing between the first electrode E1 and the second electrode E2.

The first semiconductor layer 151 may be a p-type semiconductor layer and the second semiconductor layer 153 may be an n-type semiconductor layer, respectively. In the following description, they are referred to as the first and second semiconductor layers 151 and 153, for convenience of illustration. In addition, the first electrode E1 and the second electrode E2 may be referred to as a p-type electrode or an n-type electrode depending on the electrical connection relation, i.e., depending on a semiconductor layer which forms the electrical connection. However, they may be referred to as the first electrode and the second electrode, respectively, for convenience of illustration. In addition, in the following description, the first semiconductor layer 151 and the second semiconductor layer 153 will be described as a p-type semiconductor layer and an n-type semiconductor layer, respectively. On the contrary, the first semiconductor layer 151 and the second semiconductor layer 153 may be an n-type semiconductor layer and a p-type semiconductor layer, respectively.

The first semiconductor layer 151 is disposed on the active layer 152 to provide holes into the active layer 152. According to an exemplary embodiment of the present disclosure, the first semiconductor layer 153 may be made of a p-GaN semiconductor material. The p-GaN semiconductor material may be GaN, AlGaN, InGaN, or AlInGaN. As the impurities used for doping the second semiconductor layer 153, Mg, Zn, Be, etc. may be used.

The second semiconductor layer 153 provides electrons into the active layer 152. According to an exemplary embodiment of the present disclosure, the second semiconductor layer 153 may be made of a n-GaN semiconductor material. The n-GaN semiconductor material may be GaN, AlGaN, InGaN, or AlInGaN. As impurities used for doping the second semiconductor layer 151, Si, Ge, Se, Te, C, etc. may be used.

The active layer 152 is disposed on the second semiconductor layer 153. The active layer 152 has a multi-quantum well (MQW) structure having a well layer and a barrier layer having a higher bandgap than that of the well layer. According to an exemplary embodiment of the present disclosure, the active layer 152 may have a multiple quantum well structure such as InGaN/GaN.

The first electrode E1 is electrically connected to the first semiconductor layer 151 and is connected to the drain electrode DE or the source electrode SE of the driving transistor T2 as a driving thin film pixel. The second electrode E2 is connected to the common power line CPL.

The first electrode E1 may be a p-type electrode, and the second electrode E2 may be an n-type electrode. The type of the first electrode E1 and the second electrode E2 may be determined depending on whether they supply electrons or holes, i.e., whether they are electrically connected to the p-type semiconductor layer or the n-type semiconductor layer. In the following description, however, they are referred to as the first electrode E1 and the second electrode E2 for convenience of illustration.

Each of the first and second electrodes E1 and E2 according to an exemplary embodiment of the present disclosure may be made of a metal material such as Au, W, Pt, Si, Ir, Ag, Cu, Ni, Ti or Cr or at least one alloy thereof. According to another exemplary embodiment of the present disclosure, each of the first and second electrodes E1 and E2 may be made of a transparent conductive material. The transparent conductive material may be, but is not limited to, indium tin oxide (ITO) or indium zinc oxide (IZO).

A structure 154 is disposed between the first electrode E1 and the second electrode E2 on the same plane. The structure 154 may be formed of an insulating material composed of an organic material or an inorganic material and may be disposed such that it overlaps with at least a part of the first electrode E1 or the second electrode E2.

As described above, the structure 154 is disposed such that it overlaps with a part of the selected one of the first electrode E1 and the second electrode E2. One side surface of the structure 154 is disposed such that the first electrode E1 or the second electrode E2 is open. That is to say, the structure 154 is disposed between the first electrode E1 and the second electrode E2 such that it covers a certain portion of one or both of the first electrode E1 and the second electrode E2.

At least one side surface of the structure 154 has an inverted taper shape, such that the side surface that is in contact with the first electrode E1 or the second electrode E2 or both side surfaces may have an inverted taper shape.

The inverted taper shape of the structure 154 is to prevent a short-circuit that may be occurred if the LED element 150 is not correctly disposed due to a processing error during a process of disposing the pixel electrode PE and the common electrode CE so that the first electrode E1 and the second electrode E2 are electrically connected to the pixel electrode PE or the common electrode CE. The step coverage of the pixel electrode PE and the common electrode CE cannot be continued along the side surface of the inverted taper structure 154. Accordingly, it is possible to minimize a short circuit from being occurred between the first electrode E1 and the second electrode E2. A more detailed description thereon will be given below.

According to an exemplary embodiment of the present disclosure, an insulating layer made of $SiO_2$ or $SiNx$ is disposed to cover the LED element 150 so that the first semiconductor layer 151, the active layer 152 and the second semiconductor layer 153 is not exposed.

In addition, the second semiconductor layer 153, the active layer 152 and the first semiconductor layer 151 may be sequentially stacked on a semiconductor substrate to form the LED element 150. The semiconductor substrate includes a semiconductor material such as a sapphire substrate or a silicon substrate. This semiconductor substrate may be used as a substrate for growing each of the second semiconductor layer 153, the active layer 152 and the first semiconductor layer 151, and then may be separated from the second semiconductor layer 153 via a substrate separating process. The substrate separating process may be a laser lift-off or chemical lift-off process. Accordingly, as the semiconductor substrate for growth is removed from the LED element 150, the LED element 150 may have a relatively small thickness and may be accommodated in each sub-pixel SP.

FIGS. 5A and 5B are views for illustrating connection of electrodes of a light-emitting device according to an exemplary embodiment of the present disclosure.

Referring to FIGS. 5A and 5B in conjunction with FIGS. 1 to 4, a structure 160 may not be disposed inside the LED element 150. The structure 160 may not be formed together with the LED element 150, but may be disposed on the LED element 150 after the LED element 150 have been disposed on the substrate 110.

A reflective electrode 111 is disposed on the substrate 110. The reflective electrode 111 may be made of a metal having a high reflectivity to increase luminous efficiency by reflecting light emitted from the LED element 150, and may be disposed at a different position or may be eliminated depending on the type of display device including the LED element 150.

A passivation layer 113 may be disposed on the reflective electrode 111. An adhesive member 114 may be disposed on the passivation layer 113. The passivation layer 113 may protect the driving elements which are thin-film transistors disposed on the substrate 110 or various wiring electrodes and may provide a flat surface for disposing the LED element 150.

The LED element 150 is disposed on the adhesive member 114. The adhesive member 114 provides an adhesive force that allows the LED element 150 to be smoothly transferred from an intermediate transfer substrate to the substrate 110.

After the LED element 150 is disposed, a planarization layer 115 is disposed to fix the LED element 150, to connect the first electrode E1 and the second electrode E2 with the pixel electrode PE and the common electrode CE.

The structure 160 may be made of the same material as the planarization layer 115 and may be made of an insulating material such as a bank layer that may be disposed on the planarization layer 115. For example, the bank layer may be made of an organic insulating material such as benzocyclobutene, polyimide, and photoacryl. The structure 160 may be an inorganic insulator made of an inorganic material.

The structure 160 may be formed on the LED element 150 when the LED element 150 is formed on the semiconductor substrate. However, considering that one or more transfer processes are involved for the sake of process convenience, the LED element 150 may be disposed on the substrate 110 and then the structure 160 may be disposed on the LED element 150 separately.

FIGS. 6A to 6D are cross-sectional views for illustrating electrode connection of a light-emitting device according to various exemplary embodiments of the present disclosure. Various exemplary embodiments of a display device having a structure will be described with reference to FIGS. 6A to 6D in conjunction with FIGS. 1 to 5.

In the above-described structure, the structure 154 may be integrated with the LED element 150 or the structure 160 may be formed and disposed after the LED element 150 is disposed on the substrate 110.

In the display device 100 including the structures 154 and 160 shown in FIG. 6A, the first electrode E1 is connected to the pixel electrode PE and the second electrode E2 is electrically connected to the common electrode CE in the electrode contact hole (ECH) region of the LED element 150. The structures 154 and 160 are disposed between the first electrode E1 and the second electrode E2 and have a region overlapping the first electrode E1 and/or the second electrode E2. The structures 154 and 160 have an inverted taper shape with faces adjacent to the first electrode E1 or the second electrode E2.

If the LED element 150 is disposed on a location of the substrate 110 as designed, the possibility that a short-circuit is occurred between the first electrode E1 and the second electrode E2 when the pixel element PE and the common electrode CE are disposed is lowered.

Figure 6B:
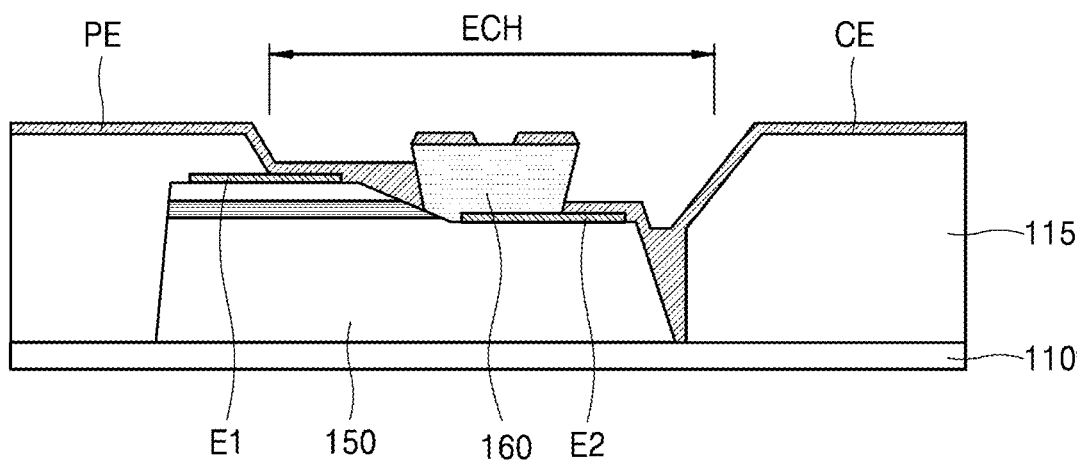

FIG. 6B shows an example where the LED element 150 is misaligned away from the location of the substrate 110 due to an error or other external issues during a disposing process. When this happens, the first electrode E1 is covered by the pixel electrode PE when the pixel electrode PE is disposed through the electrode contact hole ECH, and the pixel electrode PE overlaps with the second electrode at least partially due to the misalignment.

The structure 160 electrically insulates the pixel electrode PE from the second electrode E2, such that it is possible to minimize the electrode connection defect to prevent both the first electrode E1 and the second electrode E2 from being electrically connected to the pixel electrode PE. Alternatively, it is possible to minimize the defect that both the first electrode E1 and the second electrode E2 are connected to the common electrode CE.

That is, the display device 100 including the structure 160 can have a more flexible and highly reliable structure with respect to a processing error in disposing the LED element 150.

Figure 6C:
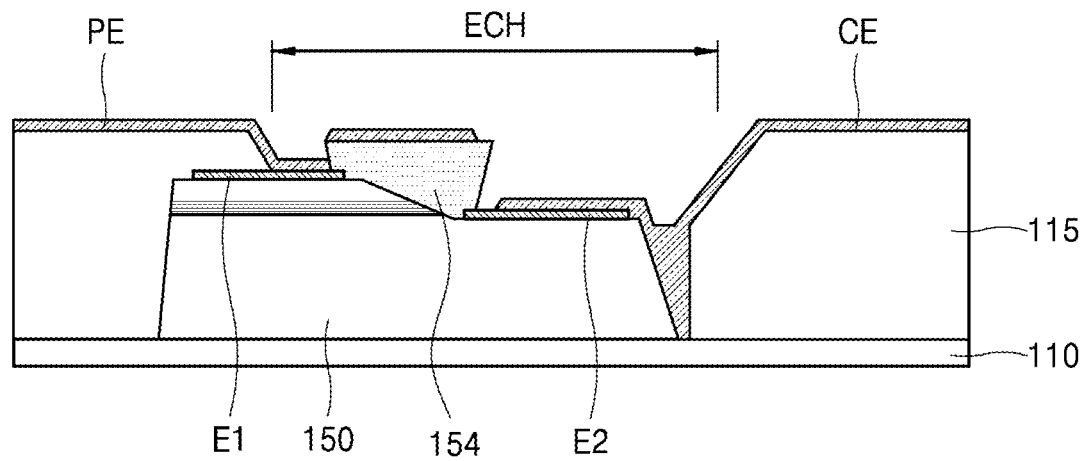

Referring to FIG. 6C, the LED element 150 includes the structure 154. Similarly to the example shown in FIG. 6B, when the LED element 150 is misaligned away from the location due to a processing error or the like, the structure 154 insulates the pixel electrode PE from the second electrode E2. As a result, it is possible to minimize the electrode connection defect to prevent both the first electrode E1 and the second electrode E2 from being electrically connected to the pixel electrode PE simultaneously.

Figure 6D:
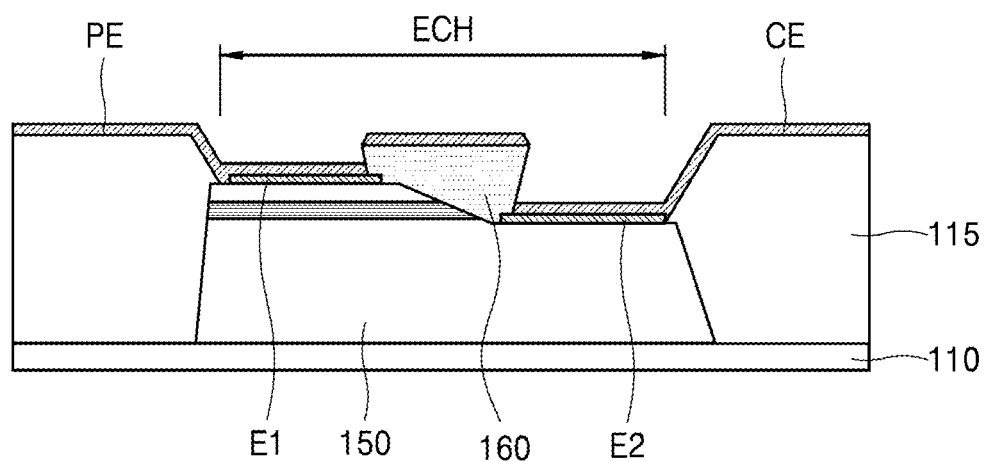

Finally, referring to FIG. 6D, the pixel electrode PE and the common electrode CE are electrically connected to the first electrode E1 and the second electrode E2 through the electrode contact hole ECH, and the pixel electrode PE and the common electrode CE should not be electrically connected to each other. However, when the size of the LED element 150 is very small, such as a few tens of micrometers or less, a defect that the pixel electrode PE is connected to the common electrode CE may occur.

Referring to FIG. 6A to FIG. 6D, the pixel electrode PE or the common electrode CE may be formed to be extend over the structure. The pixel electrodes PE connected to the first electrode E1 and the pixel electrodes PE extended over the structure 154 and 160 may be electrically disconnected to each other by the structure 154 and 160 having an inverted taper shape. The common electrode CE connected to the second electrode E2 and the common electrode CE extended over the structure 154 and 160 may be electrically disconnected to each other by the structure 154 and 160 having an inverted taper shape.

The structure 160 has an inverted taper shape, and the side adjacent to the first electrode E1 or the second electrode E2 has an inverted taper shape. Therefore, since the conductive material having a low step coverage is used in the process of disposing the pixel electrode PE and the common electrode CE, the electrical connection at the side of the structure 160 is naturally disconnected.

By virtue of the structure 160 having the inverted taper shape, it is possible to minimize defects that the pixel electrode PE is electrically connected to the common electrode CE, so that process stability can be improved and product reliability can be increased.

It will be apparent to those skilled in the art that various modifications and variations can be made in the light-emitting device and the display device using the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. An LED element comprising an n-type semiconductor layer and a p-type semiconductor layer, comprising:
   an n-type electrode connected to the n-type semiconductor layer;
   a p-type electrode connected to the p-type semiconductor layer; and
   a structure disposed between the n-type electrode and the p-type electrode to separate the n-type electrode and the p-type electrode not overlapping each other,
   wherein a side surface of the structure adjacent to the p-type electrode or the n-type electrode has an inverted taper shape, such that a top surface, furthest from the n-type semiconductor layer, has a wider cross-section than any lower cross-section of the structure, and
   wherein the structure covers and directly contacts an edge of the n-type electrode and/or the p-type electrode.

2. The LED element of claim 1, wherein:
   an angle between the side surface of the structure and a top surface of the n-type electrode, directly below the side surface of the structure, has an acute angle; and
   an angle between the side surface of the structure and a top surface of the p-type electrode, directly below the side surface of the structure, has an acute angle.

3. The LED element of claim 1, wherein the p-type electrode, the n-type electrode, or at least one of each of the p-type electrode and the n-type electrode are on a same plane with the structure.

4. The LED element of claim 1, wherein the structure is made of an insulating material.

5. A display device, comprising:
   an LED element disposed on a substrate, the LED element comprising an n-type electrode and a p-type electrode;
   a pixel electrode disposed on the substrate and connected to the p-type electrode;
   a common electrode disposed on the substrate and connected to the n-type electrode; and
   a structure disposed between the n-type electrode and the p-type electrode to separate the n-type electrode and the p-type electrode not overlapping each other,
   wherein a side surface of the structure adjacent to the p-type electrode or the n-type electrode has an inverted taper shape, such that a top surface, furthest from the n-type semiconductor layer, has a wider cross-section than any lower cross-section of the structure, and
   wherein the structure covers and directly contacts an edge of the n-type electrode and/or the p-type electrode.

6. The display device of claim 5, wherein:
   an angle between the side surface of the structure and a top surface of the n-type electrode, directly below the side surface of the structure, has an acute angle; and
   an angle between the side surface of the structure and a top surface of the p-type electrode, directly below the side surface of the structure, has an acute angle.

7. The display device of claim 5, wherein the structure is disposed such that it overlaps with the p-type electrode and/or the n-type electrode.

8. The display device of claim 5, wherein:
   the substrate comprises at least one driving element; and
   the pixel electrode is connected to the driving element.

9. The display device of claim 5, wherein a thickness of the structure is thicker than a thickness of the n-type electrode or the p-type electrode to have the inverted taper shape.

10. The display device of claim 5, wherein the pixel electrode contacts to the side surface of the structure adjacent to the p-type electrode, or the common electrode contacts to the side surface of the structure adjacent to the n-type electrode.

11. The display device of claim 5, wherein the pixel electrode and the common electrode are conductive material having a low step coverage enough to be disconnected by the inverted taper shape of the structure.

* * * * *